United States Patent [19]
Jamoua et al.

[11] Patent Number: 4,967,398
[45] Date of Patent: Oct. 30, 1990

[54] READ/WRITE RANDOM ACCESS MEMORY WITH DATA PREFETCH

[75] Inventors: Saad A. Jamoua, Oak Park; Stephen W. Hoffman, Riverview, both of Mich.

[73] Assignee: Ford Motor Company, Dearborn, Mich.

[21] Appl. No.: 390,952

[22] Filed: Aug. 9, 1989

[51] Int. Cl.$^5$ .............................................. G11C 7/00
[52] U.S. Cl. ........................... 365/230.05; 365/230.02; 365/189.04
[58] Field of Search ...................... 365/189.02, 189.04, 365/230.02, 230.05

[56] References Cited

U.S. PATENT DOCUMENTS

| | | | |
|---|---|---|---|
| 4,541,076 | 9/1985 | Bowers et al. | 365/190 |
| 4,610,004 | 9/1986 | Moller et al. | 365/230.05 |
| 4,616,310 | 10/1986 | Dill et al. | 364/200 |
| 4,623,990 | 11/1986 | Allen et al. | 365/230.05 |
| 4,627,030 | 12/1986 | Barber | 365/230.05 |
| 4,660,177 | 4/1987 | O'Connor et al. | 365/230.05 |

OTHER PUBLICATIONS

N. Siddique et al., "Metastable-Free Arbitrator Coordinates Processors", Electronic Design, Apr. 14, 1988, pp. 107-112.

Primary Examiner—Joseph A. Popek
Attorney, Agent, or Firm—Mark Mollon; Paul K. Godwin

[57] ABSTRACT

A dual port, random access, read/write memory is provided such that each microprocessor can access shared memory locations without regard to the state of the other microprocessor. Previously known dual port systems use delays, called wait states, or handshaking techniques to control memory acces and to resolve overlapping memory access requests. This invention avoids the need for special timing controls by improving memory response time. Once a valid address is placed on the address bus by the microprocessor, which is recognized by the memory as being within its range of assigned address values, the memory prefetches the data at that address may soon follow. If it does, then the data is placed on the data bus. If it does not, then the prefeteched data is ignored and a write operation takes place for the particular address.

10 Claims, 3 Drawing Sheets

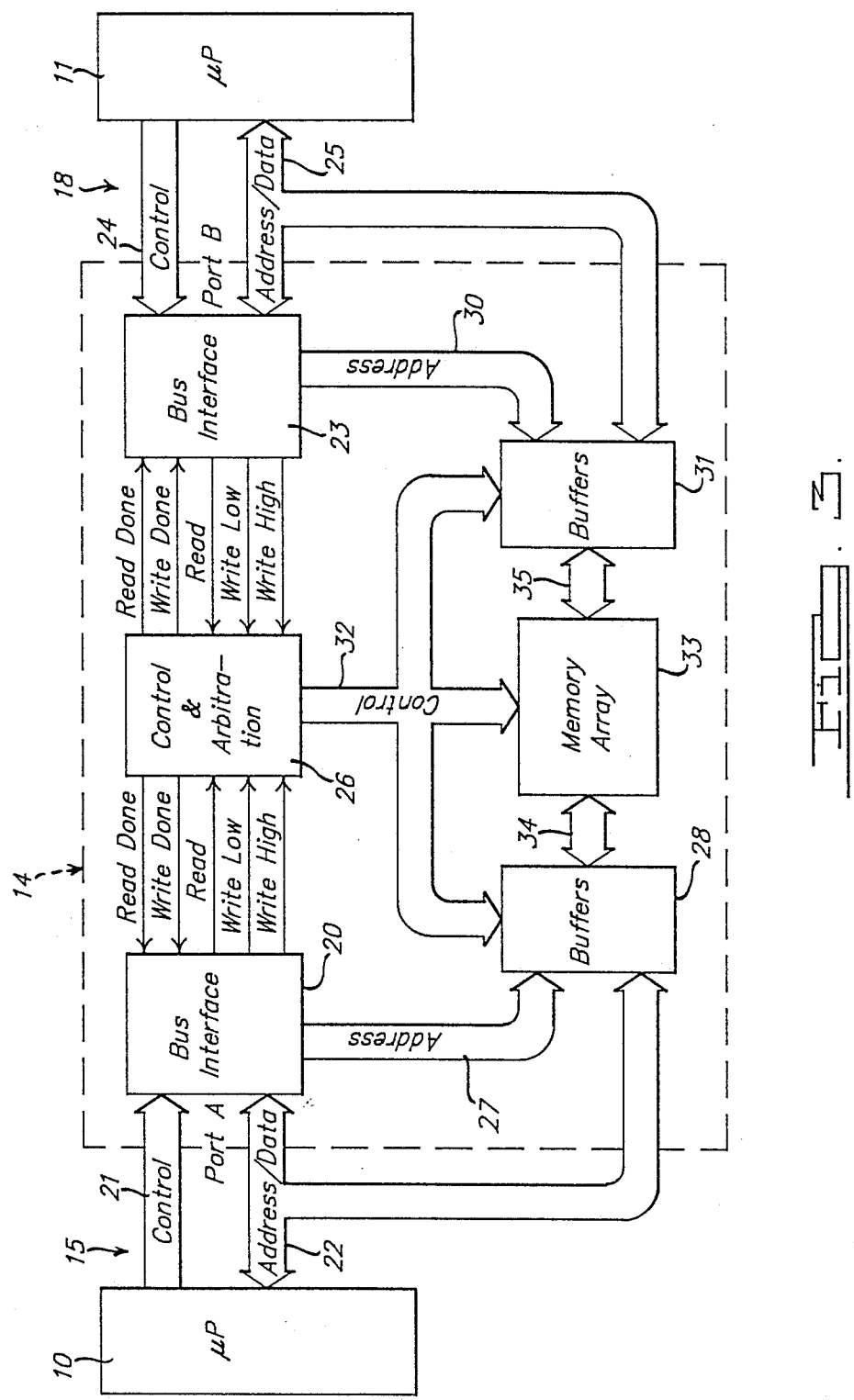

READ/WRITE RANDOM ACCESS MEMORY WITH DATA PREFETCH

BACKGROUND OF THE INVENTION

The present invention relates in general to a random access memory for use with a microprocessor having improved memory access time and more specifically to a dual-port shared memory in which memory access is obtained at a speed allowing contention between microprocessors to be resolved in a manner transparent to the dual processors.

Random access memories are available in many different configurations and with many different features for satisfying a variety of design needs. Static and dynamic memory chips are available with various memory capacities and speeds. In general, a higher speed memory results in a higher cost per bit of memory capacity due to the usual need to rely on more complex circuit design and fabrication techniques.

Dual-port memories are employed to allow sharing of a memory by a pair of separate processors. Multiple processors are frequently used in applications where the capacity or speed of a single processor is inadequate for providing the desired system operation. The use of a shared memory may be desirable where information or variables are used by both processors in performing their separate functions. For example, a first processor may control operation of a vehicle engine while a second processor may control a vehicle transmission. The separate control functions are implemented according to a plurality of sensed system parameters, some of which are used by both processors, such as engine speed, engine torque, and vehicle speed.

Various types of dual-port random access memories are known. Some memory designs allow simultaneous access from each port while other designs require that access be granted to each port separately according to an access arbitration scheme. In the case of asynchronous, arbitrated access, any delays in retrieving information requested via an access port can be handled by causing wait states in the requesting processor to allow sufficient time for retrieval of information from the memory. The addition of wait states greatly impairs the efficiency of microprocessor system operation. Alternatively, handshaking methods can be used to coordinate memory access through the dual memory ports. However, microprocessor efficiency is again reduced because of the delay from a memory access request until access is granted using the appropriate handshaking signals.

SUMMARY OF THE INVENTION

Accordingly, it is a principal object of the present invention to provide a method and apparatus for improving random access memory operating speeds.

It is a further object of the invention to achieve increased memory access speeds without any substantial increase in cost of the memory.

It is another object of the invention to provide a dual-port memory operating at a sufficiently high speed to allow asynchronous access from each port without special timing actions such as handshaking or added wait states.

These and other objects are achieved by a method for communicating data between a read/write memory and an electronic processor over a multiplexed information path. A valid address is transmitted on the information path from the processor to the memory. A control signal is transmitted from the processor to the memory indicating that the information transmitted on the information path is a valid address. The valid address is latched in the memory. The contents at the valid address are retrieved in response to the control signal and without any indication whether data is to be transferred to or from the memory. The retrieved contents are stored in a register. Either a write request or a read request will be transmitted by the processor. The contents from the register are transferred to the information path in response to a read request.

The objects are further achieved by an apparatus comprising a memory element array, a memory control, a multiplexed address/data bus, a bus latch, a control bus, and a memory output register. The memory control is coupled to the memory element array. The bus latch is coupled to the address/data bus, the memory control, and the memory element array. The control bus is coupled to the bus latch and the memory control for conducting an address-valid signal that causes the bus latch to latch the contents conducted on the address/data bus as a memory address. The control bus also functions to conduct a direction signal for indicating the direction of data flow for writing into or reading out from the memory. The address-valid signal is conducted on the control bus at a time prior to a corresponding direction signal. The memory output register is coupled to the memory element array and the memory control. The memory control causes the contents of the memory element array at the memory address to be transferred to the memory output register upon the occurrence of an address-valid signal. The memory control causes the contents of the memory output register to be driven onto the address/data bus upon the occurrence of a direction signal corresponding to the reading out of data from the memory.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 3 is a block diagram showing a dual-port, transparent access, shared memory according to the present invention.

DETAILED DESCRIPTION OF PREFERRED EMBODIMENTS

Figure 1:
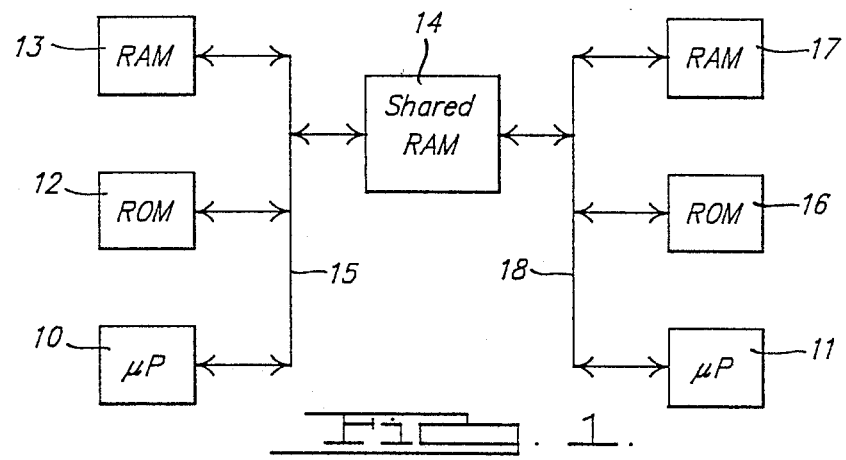
FIG. 1 is a block diagram showing a typical multiprocessing system.

Referring now to FIG. 1, a microprocessor system is shown including a microprocessor 10 and a microprocessor 11. Microprocessor 10 is coupled via a bus 15 to a read-only memory (ROM) 12, a random access memory (RAM) 13, and a shared RAM 14. Microprocessor 11 is coupled via a bus 18 to a ROM 16, a RAM 17, and shared RAM 14. Buses 15 and 18 preferably comprise separate control buses and address/data buses. Most microprocessors employ a multiplexed address/data bus in order to reduce the number of external chip connections (i.e., pin outs) to a manageable number.

Due to the microprocessor configuration employed in FIG. 1, there is a possibility that microprocessor 10 and microprocessor 11 will attempt access to shared RAM 14 simultaneously. There are memory designs which allow simultaneous access to the memory through a plurality of ports. However, these designs suffer from disadvantages in complexity, cost, and size for a given memory capacity. It is also known from the prior art to provide contention resolution when simultaneous requests for memory access occur.

Arbitration of a memory contention can be resolved on a first come, first serve basis or can be accomplished by establishing predetermined time slots for access through each respective port (i.e., time multiplexing). In any case, the provision of a shared RAM with only one port being able to access memory at a time will slow memory response time during conflicting memory access requests. Overall system operating speed will be affected if microprocessors 10 or 11 are required to wait following a request for access to shared RAM 14.

Memory contention can be handled by handshaking techniques in which a separate request line is provided between each microprocessor and the shared memory. The memory arbitrates the requests and grants access directly to a respective microprocessor via separate grant lines connected between the memory and each microprocessor. After a microprocessor issues a memory access request, it monitors its grant line until it is granted memory access. It can then proceed as though it were the only microprocessor connected to the memory. However, efficiency is lost because the delay in being granted access can be long.

Figure 2A:
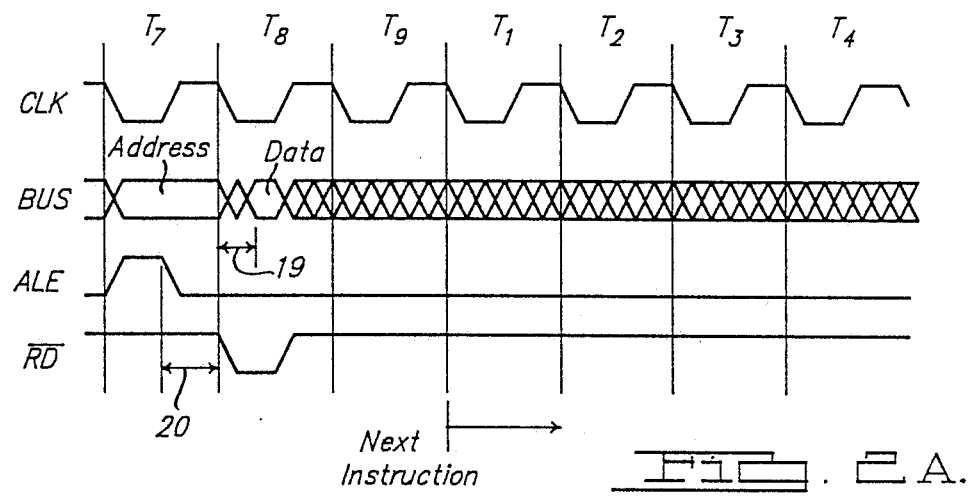
FIGS. 2A and 2B are timing diagrams showing memory access by a typical microprocessor.

It is also known to include wait states in the operation of the microprocessors to provide sufficient time for arbitrated access by two ports. However, wait states also reduce efficiency as will become more apparent from consideration of the timing diagrams of FIG. 2 which correspond to an arbitrary microprocessor instruction. The execution of a microprocessor instruction is performed during an instruction cycle which is determined by an operation code for that instruction. Each instruction cycle includes a plurality of machine states (numbered $T_1$, $T_2$, $T_3$, . . . ) corresponding to cycles of the microprocessor system clock. The timing diagram of FIG. 2A illustrates the timing of several signals during a memory read operation at the end of an instruction cycle. A clock signal CLK defines machine states $T_7$, $T_8$, and $T_9$ of one instruction cycle and machine states $T_1$ onward for a next instruction cycle. The contents of the multiplexed address/data bus are shown along with two control signals, namely, an address latch enable ALE signal for indicating that a valid address is contained on the bus, and an inverted read signal RD/ for signaling that data is to be read from memory and placed on the bus (a slash at the end of a signal designation indicates that the corresponding logic variable is true when the signal is low).

As shown in FIG. 2A, an address corresponding to a location in memory is placed on the bus by the microprocessor during machine state $T_7$. The ALE signal is also initiated during machine state $T_7$ and the memory latches the address for further processing during the negative transition of the ALE signal. The microprocessor indicates that data is to be read from the latched address by initiating a negative transition of the RD/ signal. After a delay 19 corresponding to the memory access time, the retrieved contents from the memory location are placed on the bus by the memory as output data. The microprocessor latches the data from the bus at the time of the positive transition in the RD/signal. Thus, the data must be ready on the bus at the time expected by the microprocessor. Typically, the positive transition in the RD/signal coincides with a positive transition in the CLK signal.

Figure 2B:
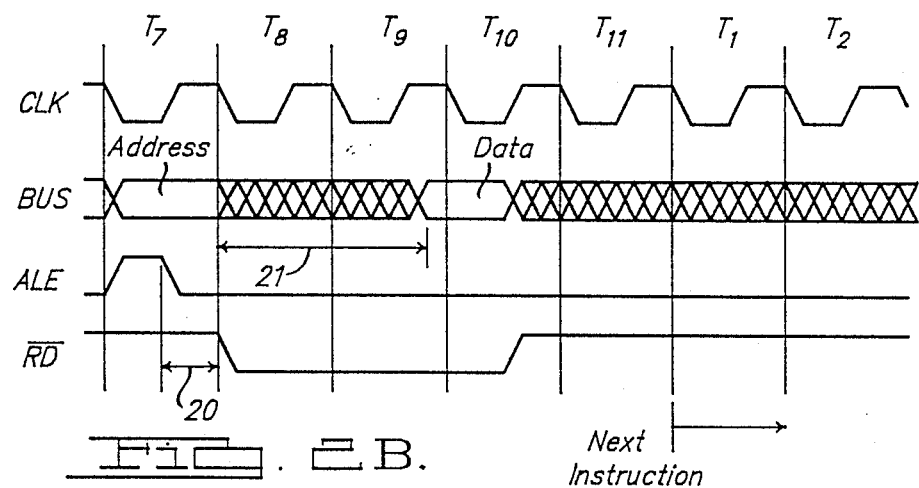

When the data read from memory will not be available during the machine state in which the read signal is issued, additional machine states known as wait states can be inserted between the initiation of the read request and latching of the data by the microprocessor, as shown in FIG. 2B. A memory access time 21 is shown which is greater than 1½ clock cycles. Therefore, two wait states $T_8$ and $T_9$ are inserted so that data is latched by the microprocessor at the positive transition in the CLK signal during machine state $T_{10}$. During the wait states, the microprocessor is unable to conduct other tasks and the speed at which the microprocessor executes its program is reduced.

Memory access times 19 and 21 are measured in FIGS. 2A and 2B from the beginning of machine state $T_8$ corresponding to the initiation of the read signal. In prior art memories, no memory access is initiated prior to receipt of the read signal since it is not known whether the latched address is to be read from or written to. As a result, a time period 20 between the latching of the address on the bus until the issuing of the read signal transpires during which the memory takes no action. According to the present invention, it is recognized that this time period can be used by the memory in order to improve apparent memory response time. Thus, according to the invention, when a signal is transmitted by the microprocessor indicating that a valid address has been placed on the address bus, that address is latched in a storage register within the memory. If the address corresponds to a memory location within the memory, the contents at that address are retrieved prior to receiving any indication whether data is to be transferred to or read from the memory address. Once the contents are retrieved, they are stored in a register. At a time subsequent to the transmission of the valid address signal, the microprocessor transmits either a write command or a read command to the memory. In response to a read request, the stored register contents corresponding to the address are immediately transferred from the register to the data bus. If a write request is received, the register contents are ignored. Thus, memory read cycle timing is improved by the data prefetch feature of the foregoing method.

In a dual-port memory, where the multiport nature of the memory is to remain transparent to each accessing microprocessor (i.e., there are no wait states or handshaking introduced), the most critical memory cycle is the read cycle. This is because a typical microprocessor may require data to be outputted to the data bus in less than 70 nanoseconds after a read request is issued. In the case of a contention arising by simultaneous requests from two microprocessors, the two requests have to be satisfied within the 70 nanosecond requirement. The data prefetch feature solves this problem by prefetching and storing data in a register as soon as the address is valid and before any actual read or write requests are issued by the microprocessor. If a read request is then issued, the data is merely driven onto the bus from the storage register. If a write request is issued, the prefetched data is ignored and a normal write cycle is executed. The data prefetch feature allows an additional half clock cycle for contention resolution and memory access, and will allow the use of slower memory devices while maintaining the full transparency feature.

Referring to FIG. 3, shared RAM 14 is shown in greater detail. Microprocessor 10 is coupled to port A via bus 15 which includes a control bus 21 and a multiplexed address/data bus 22. Control bus 21 is coupled to a bus interface 20 in port A. Address/data bus 22 is coupled to bus interface 20 and to memory buffers 28. An address bus 27 couples bus interface 20 to buffers 28.

Microprocessor 11 is coupled to port B of shared RAM 14 via bus 18 which includes a control bus 24 and an address/data bus 25. Control bus 24 is coupled to a bus interface 23 in port B. Address/data bus 25 is coupled to bus interface 23 and to memory buffers 31. Bus interface 23 is coupled to buffers 31 via an address bus 30.

Bus interface 20 and bus interface 23 are each coupled to a control and arbitration circuit 26 which controls the operation of a memory array 33 and memory buffers 28 and 31 by signals communicated over a control bus 32. Memory array 33 is further coupled to memory buffers 28 and 31. Memory array 33 is preferably configured to have a low byte and a high byte corresponding to even and odd memory addresses, respectively, in a word organized memory. Thus, reading from and writing to the memory array can be to either the low byte or high byte at a particular address. The control lines connected between each bus interface and the control and arbitration circuit 26 include a READ request line, a WRITE LOW request line, and a WRITE HIGH request line. READ DONE and WRITE DONE lines are connected from control and arbitration circuit 26 to each bus interface for resetting a memory access request after servicing.

In operation, when microprocessor 10 attempts to access a location in memory array 33, it first places the appropriate address on address/data bus 22. Control bus 21 includes an address-valid control line, and this line is switched to a level indicating that a valid address is on bus 22. In response to the valid-address signal, bus interface 20 latches the address on bus 22 and examines the address to determine whether the address is within the range of addresses which are accessible to it in memory array 33. If the address is in range, bus interface 20 issues a READ signal to control and arbitration circuit 26 to request the reading of the contents of the address which are provided by bus interface 20 to memory buffer 28 over address bus 27.

As soon as the memory is available, control and arbitration circuit 26 issues a control signal over control bus 32 to enable reading of memory array 33 through buffers 28. The data is read from memory array 33 into buffers 28 and is stored there until a further control signal is received from microprocessor 10 to indicate whether the memory access by microprocessor 10 is a READ or a WRITE. If a READ signal is received from microprocessor 10, buffers 28 are enabled via control and arbitration circuit 26 to drive address/data bus 22 with the retrieved data stored in buffers 28. If a WRITE signal is received from microprocessor 10, bus interface initiates a further memory access request to control and arbitration circuit 26 to write the high or low byte in memory array 33. The data to be written is latched from address/data bus 22 into buffers 28 and is then written into memory array 33 upon granting of access by control and arbitration circuit 26.

Figure 4:
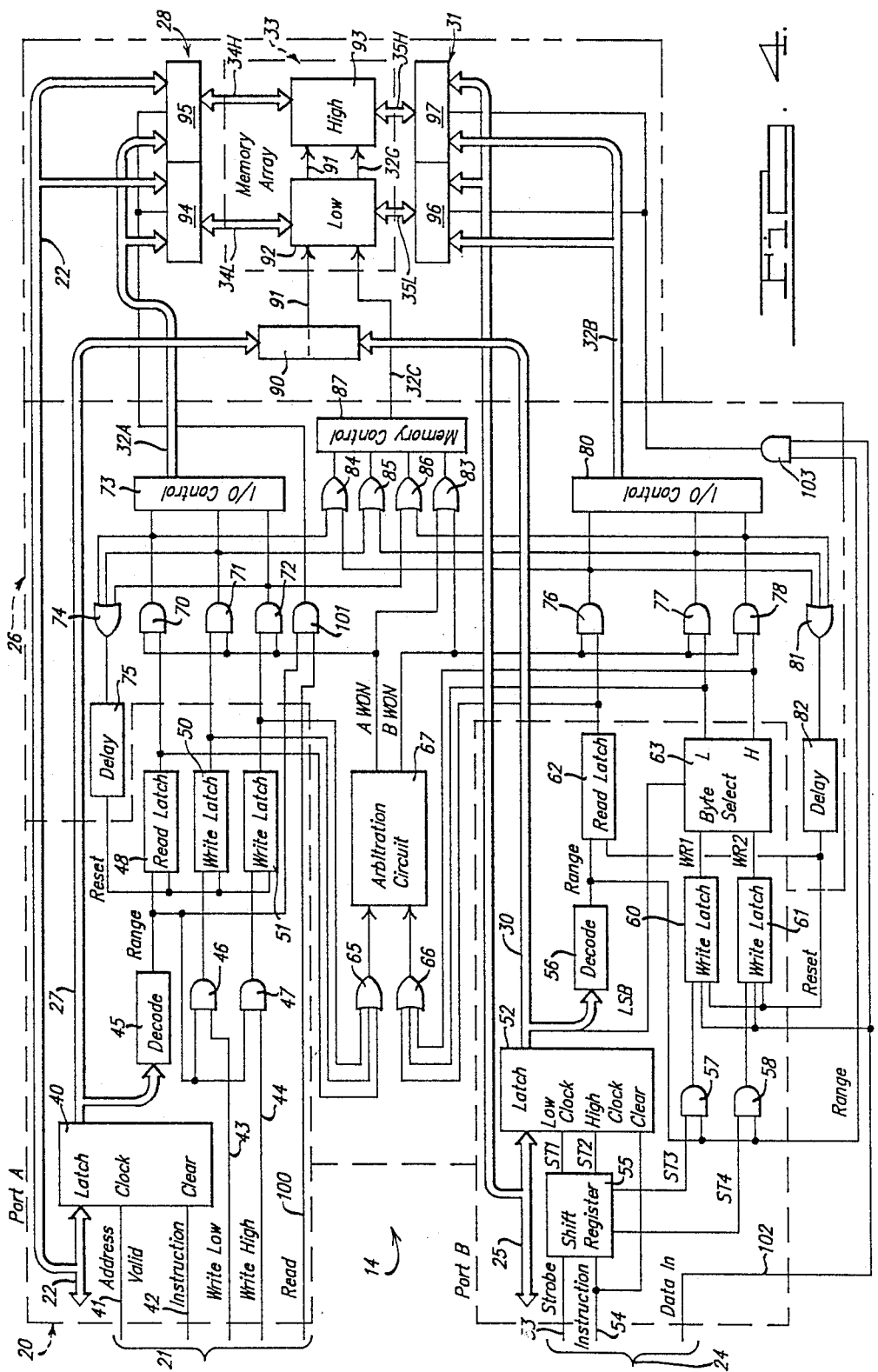
FIG. 4 is a schematic, block diagram showing a dual-port memory according to the present invention in greater detail.

Turning to FIG. 4, a detailed embodiment of shared memory 14 will be described. For purposes of illustration, port A is shown having a configuration for interfacing to the 80C196 microcontroller manufactured by Intel Corporation and port B is shown having a configuration for interfacing with an Intel 8061 Microcontroller. Although a dual-port, asynchronous memory is shown in FIG. 4, it will be understood that memories having fewer or greater number of ports or with synchronous access can likewise benefit from the data prefetch feature of the present invention.

Address/data bus 22 is coupled to an address latch 40 in bus interface 20 for port A. In accordance with the architecture of the 80C196 microcontroller, bus 22 is a 16-bit bidirectional multiplexed address/data bus. Bus 22 is further coupled to buffer 28. Control bus 21 included in port A comprises an address valid line 41 coupled to the clock input of latch 40, and instruction line 42 coupled to the clear input of latch 40, a WRITE LOW line 43 connected to one input of an AND gate 46, a WRITE HIGH line 44 connected to one input of an AND gate 47, and a READ line 100 coupled to one input of an AND gate 101. The latched address output of latch 40 is connected to an address bus 27 which is further connected to a decode circuit 45 and an address decoder and driver 90. Decode circuit 45 preferably includes a plurality of comparators for checking the value of the address and for providing a RANGE signal to the SET input of a READ latch 48, to another input of AND gate 46, to another input of AND gate 47, and to another input of AND gate 101. The output of AND gate 46 is connected to the SET input of a WRITE latch 50 and the output of AND gate 47 is connected to the SET input of a WRITE latch 51. The reset inputs of latches 48, 50, and 51 are connected to the output of a delay circuit 75 in control and arbitration circuit 26 which provides a RESET signal as will be described below. Latches 48, 50, and 51 preferably are comprised of D flip-flops.

The output of READ latch 48 is connected to one input of an OR gate 65 and to one input of an AND gate 70. The output of WRITE latch 50 is connected to another input of OR gate 65 and to an input of AND gate 71. The output of WRITE latch 51 is connected to another input of OR gate 65 and to one input of an AND gate 72. The output of OR gate 65 is connected to one input of an arbitration circuit 67 which may be comprised of a 74F786 bus arbiter integrated circuit manufactured by Signetics Corporation. Arbitration circuit 67 provides an AWON signal to indicate whether port A has been granted access to the memory. The AWON output is connected to the remaining inputs of AND gates 70, 71, and 72, and one input of an OR gate 83. The outputs of AND gates 70, 71, and 72 are each connected to respective inputs of an I/O control 73 and respective inputs of an OR gate 74. The output of OR gate 74 is coupled to the input of delay circuit 75. The output of AND gate 101 is connected to memory buffer 28.

The output of AND gate 70 is further connected to one input of an OR gate 84. The output of AND gate 71 is further connected to one input of an OR gate 85. The output of AND gate 72 is further connected to one input of an OR gate 86.

The output of I/O control 73 is connected to a port A control bus 32A which is further connected to a low-byte buffer 94 and to a high-byte buffer 95 both included in buffer 28.

Considering now the connection to port B which is configured to host an 8061 microcontroller, address-/data bus 25 is an 8-bit bidirectional multiplexed address/data bus (commonly referred to as an MBUS) and is connected to the inputs of an address latch 52 and to memory buffer 31. Control bus 24 includes a strobe line 53 connected to the clock input of a shift register 55, an instruction line 54 connected to the clear input of shift register 55 and the clear input of address latch 52, and a data-in line 102 which is connected to one input of an AND gate 103 and to the D inputs of a pair of latches 60 and 61.

Shift register 55 is configured such that its outputs ST1, ST2, ST3, and ST4 go HIGH in sequence when shift register 55 is clocked by strobe line 53. All outputs are restored to a LOW value when shift register 55 is reset by a signal on instruction line 54. Line ST1 is connected to a LOW address byte clock input of latch 52. The ST2 output of shift register 55 connected to the HIGH address byte clock input of latch 52. The ST3 output is connected to one input of an AND gate 57 and output ST4 is connected one input of an AND gate 58.

The latched addressed output of address latch 52 is provided on a 16-bit address bus 30 which is also connected to a decode circuit 56 and to address decoder and driver 90. The least significant bit of address bus 30 is further connected to a byte select circuit 63.

Decode circuit 56 preferably includes two 8-bit comparators for decoding the address on address bus 30 and determining whether the address is within the range accessible by port B. A RANGE output signal is provided from decode circuit 56 to the SET input of a READ latch 62, to another input of AND gate 57, to another input of AND gate 58, and to another input of AND gate 103. The output of AND gate 57 is connected to the clock input of a WRITE latch 60. The output of AND gate 58 is connected to the clock input of a WRITE latch 61. The reset inputs of latches 60, 61, and 62 are each connected to the output of a delay circuit 82 for providing a RESET signal. Latches 60, 61, and 62 preferably are comprised of D flip-flops.

The output of WRITE latch 60 provides a WR1 signal to byte select circuit 63 for indicating the timing of a first write operation. The output of WRITE latch 62 provides a WR2 signal to byte select circuit 63 for providing the timing of a second write operation.

The output of READ latch 62 is connected to one input of an AND gate 76 and to one input of an OR gate 66. A low-byte output from byte select circuit 63 is connected to one input of an AND gate 77 and to another input of OR gate 66. A high-byte output of byte select circuit 63 is connected to one input of an AND gate 78 and to another input of OR gate 66. The output of OR gate 66 is connected to a port B request input of arbitration circuit 67. A BWON signal is provided from arbitration circuit 67 to an input of OR gate 83 and to the remaining inputs of AND gates 76, 77, and 78.

The output of AND gate 76 is connected to one input of an OR gate 81, an input of an OR gate 84, and an input of an I/O control 80. The output of AND gate 77 is connected to another input of OR gate 81, another input of OR gate 85, and another input of I/O control 80. The output of AND gate 78 is connected to another input of OR gate 81, another input of OR gate 86, and another input of I/O control 80. The output of OR gate 81 is connected to delay circuit 82.

The output of I/O control 80 is connected to a port B control bus 32B which is connected to low byte buffer 96 and high byte buffer 97 included in memory buffer 31.

The outputs of OR gates 83, 84, 85, and 86 are connected to a memory control 87 which provides outputs on control bus 32C that is also connected to memory array 33. Memory array 33 includes a low byte portion 92 and a high byte portion 93. Address decoder and driver 90 is connected to a memory control bus 91 for driving memory array 33. This type of memory configuration and memory control are known in the art.

Low byte portion 92 of memory array 33 is connected to port A low byte buffer 94 through a bus 34L. High byte portion 93 is connected to port A high byte buffer 95 through a bus 34H. Low byte portion 92 is connected to port B low byte buffer 96 through a bus 35L. High byte portion 93 of memory array 33 is connected to port B high byte buffer 97 through a bus 35H.

The operation of the shared memory shown in FIG. 4 will now be described.

Memory access by port A will be considered first. At the beginning of an instruction cycle, a signal on instruction line 42 indicating the new instruction cycle clears address latch 40. Later, during the instruction cycle, the microprocessor attached to port A attempts to access memory by placing the desired memory address on bus 22. The microprocessor then initiates the ADDRESS VALID signal on ADDRESS VALID line 41, which clocks address latch 40 so that the address on bus 22 is latched in address latch 40.

Latch 40 drives bus 27 with the latched address which is then received by decode circuit 45. Decode circuit 45 compares the address on bus 27 with a predetermined range of addresses corresponding to the accessible locations in memory array 33. If the address is in range, the RANGE signal sets READ latch 48 high and enables AND gates 46 and 47, which act as transmission gates for write lines 43 and 44. When READ latch 48 is set, its output causes the output of OR gate 65 to initiate the action of arbitration circuit 67. As soon as there are no other prior access requests still pending, arbitration circuit 67 grants memory access to port A by causing the AWON signal to go high. The AWON signal enables memory control 87 through chip enable OR gate 33.

The high output from READ latch 48 and the high AWON signal input through AND gate 70 causes the output of AND gate 70 to go high, thereby enabling I/O control 73. Control signals on control bus 32A configure memory buffer 28 to receive data from memory array 33. The memory address corresponding to the desired read operation is contained in address decoder and driver 90 from bus 27. Memory control 87 sends control signals over control bus 32C for initiating the read operation. Thus, in response to the ADDRESS VALID signal received from the microprocessor, the contents of memory array 33 at the latched address are transferred to memory buffer 28.

In the event that the microprocessor then indicates that it desires a memory read operation, a READ signal received on read line 100 goes high. Since the RANGE signal is high, the output of AND gate 101 also goes high. A high level signal is transmitted from AND gate 101 to memory buffer 28. The high signal configures memory buffer 28 to drive the previously received memory contents onto address/data bus 22.

In the meantime, when port A was granted access to memory array 33 by arbitration circuit 67 and the output of AND gate 70 went high, the output of OR gate 74 also went high, thus initiating the action of delay circuit 75. After a predetermined delay time corresponding to the known time period required to access memory array 33 and store the memory contents in buffer 28, delay circuit 75 produces a RESET signal for resetting latches 48, 50, and 51, thus removing the memory access request signal from the output of OR gate 65.

In the event that the microprocessor is performing a write operation to memory array 33 rather than a read operation, the data to be written to the already latched memory address is placed on bus 22 by the microprocessor. The RANGE signal continues at a high level from decode circuit 45 and transmission AND gates 46 and 47 continue to be enabled. A WRITE signal on write low line 43 or write high line 44 is thus transmitted to a respective write latch 50 or 51. The output of write latch 50 or 51 then initiates a memory access request through OR gate 65 to arbitration circuit 67. When memory access is granted by the AWON signal, memory control 87 receives a memory enable signal through chip select OR gate 83. AND gate 71 or 72 then have both inputs at a high level thus causing one of their outputs to also go to a high level. The high output from AND gate 71 or 72 initiates a write low or a write high signal to memory control 87 through OR gates 85 or 86. The high output from AND gate 71 or 72 also causes I/O control 73 to cause memory buffer 28 to latch the data contents of bus 22 for writing to memory array 33. The high output of AND gate 71 or 72 also initiates the delay timing of delay circuit 75 through OR gate 74. Memory control 87 causes the latched contents of memory buffer 28 to be transferred to the address specified in address decoder and driver 90 from either low byte buffer 94 or high byte buffer 95 and over the appropriate bus 34L or 34H. After the delay provided by delay circuit 75, write latch 50 or write latch 51 is reset by the RESET signal and the output of the write latch returns to a low level thus removing the memory access request from arbitration circuit 67.

After either the read or write access is completed and the arbitration circuit granting signal AWON returns to a low level, the output of OR gate 83 disables memory control 87 and the outputs of AND gates 70, 71, and 72 disable I/O control 73. After a microprocessor read operation, the READ signal on read line 100 returns to a low level thus disabling the output of AND gate 101 and preventing memory buffer 38 from driving data onto bus 22. A succeeding instruction begins and causes address latch 40 to be cleared and the RANGE signal from decode circuit 45 to go low. Port A is then ready to receive another memory access request.

The operation of port B is substantially identical to the operation of port A, except that the interface to the microprocessor is different since port B is configured to host the 8061 microcontroller. In this case, bus 25 is an 8-bit multiplexed address/data bus so that one-half of each 16-bit address in memory or a 33 is latched in succession. Control bus 24 includes a strobe line 53 for carrying strobe pulses for defining times that addresses and data are valid on bus 25. The strobe pulses are decoded by a serial-in, parallel-out shift register having its clock input connected to strobe line 53. The data input of shift register 55 is connected to a high level voltage (not shown). Shift register 55 is initially reset by the INSTRUCTION signal on instruction line 54. Thereafter, each pulse on strobe line 53 causes outputs ST1, ST2, ST3, and ST4 to sequentially assume a high level. ST1 causes address latch 52 to latch the low byte portion of an address being transmitted over bus 25. ST2 clocks latch 52 in order to latch the high byte portion of the address. The latched 16-bit address is placed on address bus 30 and is decoded by decoder circuit 56. The address is compared with the predetermined range of addresses and a RANGE signal is provided to read latch 62. An in-range address causes a reading of the high or low byte pointed to by the address on address bus 30 in the same manner as described above with regard to port A.

The memory contents at the address specified through port B are retrieved and are stored in the corresponding portion of memory buffer 31. If the microprocessor connected to port B is attempting a read operation, a DI signal will be transmitted on the data-in line 101 causing the output of AND gate 103 to go high which causes the contents of memory buffer 31 to be driven onto address/data bus 25.

When the microprocessor connected to port B is executing a write operation to the shared memory, a first byte to be written to memory is placed on bus 25. The microprocessor initiates a strobe pulse on line 53 which appears as an ST3 output from shift register 55. In response to the ST3 signal, the output of AND gate 57 clocks write latch 60. If signal DI on line 102 indicates a write operation, then an output signal from write latch 60 is provided to byte select circuit 63 to indicate that a first byte of data is to be written to memory array 33.

According to the protocol of the 8061 microprocessor, the first byte to be written can be either a high byte or a low byte depending on the value of the least significant bit of the 16-bit address. Thus, the least significant bit (LSB) is provided to byte select circuit 63. Either a low byte output or a high byte output from byte select circuit 63 goes high depending on the value of LSB. The high signal generated by byte select circuit 63 is connected to either AND gate 77 or AND gate 78 and to an input of OR gate 66. Subsequent operation of the write cycle is substantially identical to the write cycle described for port A.

If the remaining low or high byte adjacent to the initial address is also to be written to, the microprocessor places the appropriate data on bus 25 and initiates another strobe pulse on strobe line 53. The ST4 output of shift register 55 is transmitted through AND gate 58 and clocks write latch 61. Assuming signal DI is still high, an output signal from write latch 61 is transmitted to byte select circuit 63 to indicate that a second byte is to be written to memory array 33. Byte select circuit 63 selects the proper low or high byte within the same word-aligned boundary by toggling the LSB of the address and the write operation continues as with the first write operation.

In the event of conflicting memory access requests from port A and port B, the most critical memory cycle is the read cycle since both read requests may have to be satisfied within the time period corresponding to the shortest read response specification of the microprocessors hosted by the shared memory. The data prefetch feature described above maintains full transparency of the dual port nature of the memory by enabling all memory access requests to be satisfied in the shortest possible time. Increased memory access speeds are achieved without any substantial increase in the cost of the memory. Wait states and handshaking techniques are avoided in the hosted microprocessors and high operating efficiency is maintained.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method for communicating data between a read/write memory and an electronic processor over a multiplexed information path, said method comprising the steps of:
   transmitting a valid address on said information path from said processor to said memory;
   transmitting a signal from said processor to said memory indicating that the information transmitted on said information path is a valid address;
   latching said valid address in said memory in response to said signal indicating a valid address;
   retrieving the contents at said valid address in response to said signal and without any indication whether data is to be transferred to or from said memory;
   storing said contents in a register;
   transmitting either a write request or a read request from said processor to said memory; and
   transferring said contents from said register to said information path in response to said read request.

2. The method of claim 1 further comprising the steps of:
   determining, after latching said valid address in said memory, whether said valid address corresponds to an address within said memory; and
   suspending said retrieving step until a succeeding address is transmitted to said memory if said valid address does not correspond to an address within said memory.

3. A method for operating a read/write memory having a multiplexed address/data bus, said memory comprising a plurality of memory elements corresponding to a predetermined range of addresses, said method comprising the steps of:
   recurrently comparing the digital values transmitted on said bus with said predetermined range;
   transferring the contents of a memory element address, corresponding to one of said digital values, to a memory output register in response to said one digital value being within said predetermined range;
   receiving over said bus either a read request or a write request; and
   transferring the contents of said memory output register to said bus in response to said read request.

4. Apparatus comprising:
   a memory element array, each element having a unique address;
   a memory control coupled to said memory element array;
   a multiplexed address/data bus;
   a bus latch coupled to said address/data bus, to said memory control, and to said memory element array;
   a control bus coupled to said bus latch and to said memory control for conducting an address-valid signal to cause said bus latch to latch the contents conducted on said address/data bus as a memory address and for conducting a direction signal for indicating the direction of data movement for writing into or reading out from said memory, said address-valid signal being conducted on said control bus at a time prior to a respective direction signal during an access to said apparatus; and
   a memory output register coupled to said memory element array, to said memory control, and to said address/data bus;
   said memory control causing the contents of said memory element array at said memory address to be transferred to said memory output register upon the occurrence of an address-valid signal and causing the contents of said memory output register to be transferred to said address/data bus upon the occurrence of a direction signal corresponding to the reading out of data from said memory.

5. A dual port memory comprising:
   a first port including a first control bus for conducting a first valid-address signal and a first read signal and including first multiplexed bus means for conducting address and data signals;
   a second port including a second control bus for conducting a second valid-address signal and a second read signal and including second multiplexed bus means for conducting address and data signals;
   a plurality of memory elements randomly accessible via unique addresses through either of said ports;
   first register means coupled to said first port and to said memory elements for buffering data being transmitted from said memory elements to said first multiplexed bus means;
   second register means coupled to said second port and to said memory elements for buffering data being transmitted from said memory elements to said second multiplexed bus means;
   control means coupled to said first and second ports, said first and second register means, and said memory elements for controlling write and read access to said memory elements, said control means transferring data from a selected memory element to one of said register means in response to a valid-address signal on the respective one of said control buses, thereafter said control means transferring the contents of said one register means to the respective multiplexed bus means in response to a respective read signal on the respective one of said control buses.

6. The memory of claim 5 wherein only one of said ports can access said plurality of memory elements at a time, said memory further comprising arbitration means coupled to said first port, said second port, and said control means for enabling said control means to control access to said memory elements by only one of said ports at a time.

7. The memory of claim 6 wherein said arbitration means includes comparison means for determining which port is first to request access to said memory elements.

8. The memory of claim 7 further comprising:
   first delay means coupled to said control means for terminating an access request corresponding to said first port after a first predetermined delay; and second delay means coupled to said control means for terminating an access request corresponding to said second port after a second predetermined delay.

9. The memory of claim 6 wherein said arbitration means includes timing means for enabling memory access to each of said ports by time multiplexing.

10. The memory of claim 6 further comprising range means coupled to said first port, said second port, said arbitration means, and said memory control for enabling said arbitration means and said memory control only when an address on a respective bus is within a range of addresses corresponding to said plurality of memory elements.

* * * * *